(12) United States Patent
Kim et al.

(10) Patent No.: US 6,885,248 B2
(45) Date of Patent: Apr. 26, 2005

(54) SINGLE-ENDED DIFFERENTIAL CIRCUIT USING COMPLEMENTARY DEVICES

(75) Inventors: Bonkee Kim, Yongin-Si (KR); Iiku Nam, Seoul (KR); Kwyro Lee, Daejon (KR)

(73) Assignee: Integrant Technologies Inc., Seongnam-Si (KR)

( * ) Notice: Subject to any disclaimer, the term of this patent is extended or adjusted under 35 U.S.C. 154(b) by 0 days.

(21) Appl. No.: 10/714,863

(22) Filed: Nov. 18, 2003

(65) Prior Publication Data

US 2004/0100329 A1 May 27, 2004

Related U.S. Application Data

(62) Division of application No. 10/051,290, filed on Jan. 22, 2002, now Pat. No. 6,693,493.

(30) Foreign Application Priority Data

Jan. 19, 2001 (KR) .................................. 10-2001-0003277

(51) Int. Cl.$^7$ ................................................. H03F 3/45
(52) U.S. Cl. ....................................... 330/301; 330/261
(58) Field of Search .......................... 330/51, 253, 261, 330/301, 302

(56) References Cited

U.S. PATENT DOCUMENTS 6,097,250 A * 8/2000 Kamali et al. ........... 330/124 R
6,693,493 B1 * 2/2004 Kim et al. .................. 330/301

OTHER PUBLICATIONS

Anadigics Application Note for ACA0861—A,B,C,D 750/860 Mhz CATV Line Amplifiers, Rev. 2, Aug. 2001, pp. 1–16.*
Kyeongho Lee et al., A Single–Chip 2.4 Ghz Direct–Conversion CMOS Receiver for Wireless Local Loop using One –third Frequency Local Oscillator, 2000 Symposium on VLSI Circuits Digest fo Technical Papers, pp 42–45.

* cited by examiner

Primary Examiner—Steven J. Mottola
(74) Attorney, Agent, or Firm—Shinjyu Global IP Couselors, LLP (57) ABSTRACT

The present invention relates to circuits having differential structure which uses complementary devices for processing single-ended signal. The single-ended differential circuit in accordance with the present invention, comprises first and second complementary devices having first, second, and third terminals, respectively, wherein current flowing from the second terminal to the third terminal has its quantity and direction being varying in dependant on the voltage driven to the first terminal, wherein the currents flowing through the first and second complementary devices vary in opposite relationship. The single-ended differential circuit further comprises an input terminal for driving the first terminals of the first and second complementary devices with a control signal; and biasing means connected to the second and third terminals of the first and second devices, for determining biasing points of the first and second complementary devices such that the first and second devices operates in a differential relationship with respect to a signal driven to the input terminal, wherein the biasing means determining the biasing points such that one of the first and second devices is substantially active.

4 Claims, 6 Drawing Sheets

SINGLE-ENDED DIFFERENTIAL CIRCUIT USING COMPLEMENTARY DEVICES

This application is a divisional application of U.S. patent application Ser. No. 10/051,290 filed on Jan. 22, 2002, now U.S. Pat. No. 6,693,493 issued on Feb. 17, 2004. The entire disclosure of U.S. patent application Ser. No. 10/051,290, now U.S. Pat. No. 6,693,493 is hereby incorporated herein by reference.

CROSS-REFERENCE TO RELATED PATENT APPLICATIONS

Korea Priority Application 10-2001-003277, filed Jan. 19, 2001 including the specification, drawings, claims, and abstract, is incorporated herein by reference in its entirety.

BACKGROUND OF THE INVENTION

1. Field of the Invention

The present invention relates to electrical circuits. More specifically, the present invention relates to electrical circuits having a differential structure that uses complementary devices for processing single-ended signals.

2. Background Information

A circuit may be designed to have either single-ended or differential structure, both in the analogue and digital circuit application. The single-ended structure is the structure of a circuit having paired terminals, where only one of the terminals is connected either input or output terminal. In comparison with the single-ended structure, double-ended structure is known in the art. The double-ended structure is the structure of a circuit having paired terminals, where both of the paired terminals are connected to a single input or output terminal. A differential pair structure is well known in the art as an example of the double-ended structure. Differential pair structure is the structure of a circuit having double-ended structure where signal is differentially inputted and processed to and in the circuit.

A single-ended structure consumes relatively low power and produces relatively low noise. However, when a single-ended structure circuit is operating in class A or AB mode, the circuit may suffer from clamping of signal, which results in harmonic component problem.

On the other hand, differential pair circuit is not vulnerable to the interference problem. The reason is that AC current, which is not provided from power source circulates only through the circuit. Since differential pair circuit is not susceptible to the interference problem, it is advantageously used in integrating a lot of system blocks into one chip. Further, differential pair circuit is used in mixers which generally requires high level of isolation among radio frequency, local oscillation, and intermediate frequency signals.

Moreover, since differential pair circuit has symmetrical structure, even order distortion may be reduced. Because of the characteristic of reduced even order distortion, differential pair circuit is widely employed in amplifiers and mixers provided in the direct conversion receivers, which suffers from DC offset problem and, therefore, requires relatively high level of rejection characteristic of second order distortion.

There have been a lot of approaches for incorporating the advantageous characteristics of the single-ended and differential pair structures, in the analogue and digital circuit applications.

Especially in the RF circuit field, in order to use the combination of the single-ended and differential circuits, balun (balance unbalance) circuitry was necessarily used for converting single-ended signal to differential signal or differential signal to single-ended one. Balun circuitry may be made from either passive or active devices. However, when balun circuitry is made of passive devices, size of balun circuitry becomes large and, therefore, it is not easy to integrate balun circuitry in a chip. When balun circuitry is made of active devices, relatively large power consumption of the balun circuitry becomes problem especially in the RF circuit applications. Additionally, noise generated by active balun decreases signal to noise ratio.

In order to overcome this problem, it was suggested that differential pair circuitry is integrated in a chip while passive balun circuitry is provided on a PCB, thereby connecting the differential pair circuitry in the chip to the balun circuitry on the PCB. This method, however, is disadvantageous in that the passive balun circuitry has large size and manufacturing cost becomes high.

As another attempts to integrate the single-ended circuitry and differential pair circuitry in a single chip, integration of active balun circuitry in a chip has also been tried. This method, however, suffers from DC power consumption and added noise of the active balun circuitry.

In view of the above, there exists a need for a single-ended differential circuit that uses complimentary devices that overcomes the above-mentioned problems in the prior art. This invention addresses this need in the prior art as well as other needs, which will become apparent to those skilled in the art from this disclosure.

SUMMARY OF THE INVENTION

An object of the invention is to provide a circuit for processing signals from single-ended structure by using differential pair circuitry having complementary devices.

Another object of the present invention is to provide RF mixing circuit having differential pair structure by using complementary devices which can process signals from single-ended structure.

The other object of the present invention is to provide cascode amplifier circuit, which has complementarily and symmetrically connected differential pair structure by using complementary devices, thereby being able to process signals from single-ended structure.

In order to accomplish the objects, the present invention provides a single-ended differential circuit comprising: first and second complementary devices having first, second, and third terminals, respectively, wherein current flowing from the second terminal to the third terminal has its quantity and direction being varying in dependant on the voltage driven to the first terminal, wherein the currents flowing through the first and second complementary devices vary in opposite relationship; an input terminal connected to the first terminals of the first and second complementary devices; and biasing means connected to the first, second and third terminals of the first and second devices, for determining biasing points of the first and second complementary devices such that the first and second devices operates in a differential relationship with respect to a signal driven to the input terminal, wherein the biasing means determining the biasing points such that one of the first and second devices is substantially active.

In accordance with another aspect of the invention, a single-ended differential RF mixer circuit is provided, The single-ended differential RF mixer comprises: first and second complementary devices having first, second, and third terminals, respectively, wherein current flowing from the second terminal to the third terminal has its quantity and direction being varying in dependant on the voltage driven to the first terminal; wherein the currents flowing through the first and second complementary devices vary in opposite relationship; an input terminal connected to the first terminals of the first and second complementary devices; and biasing means connected to the first, second and third terminals of the first and second devices, for determining biasing points of the first and second complementary devices such that the third terminals of the first and second complementary devices are maintained at a predetermined voltage value with respect to the second terminals of the first and second complementary devices, and wherein impedance values at the third terminals vary in accordance with variation of a signal driven to the first terminals of the first and second complementary devices, when the first and second complementary devices are biased such that voltage values at the second and third terminals are adjusted to a predetermined value.

In accordance with other aspect of the invention, a single-ended differential RF mixer circuit is provided. The single-ended differential RF mixer circuit comprises: first complementary unit having first and second complementary devices which have first, second, and third terminals, respectively, wherein current flowing from the second terminal to the third terminal has its quantity and direction being varying in dependant on the voltage driven to the first terminal, wherein the currents flowing through the first and second complementary devices vary in opposite relationship; second complementary unit having third and fourth complementary devices which have first, second, and third terminals, respectively, wherein current flowing from the second terminal to the third terminal has its quantity and direction being varying in dependant on the voltage driven to the first terminal, wherein the currents flowing through the first and second complementary devices vary in opposite relationship; first input terminal connected to the first terminals of the first and second complementary devices; second input terminal connected to the first terminals of the third and fourth complementary devices; and biasing means connected to the first, second and third terminals of the first and second devices, for determining biasing points of the first and second complementary devices such that the third terminals of the first and second complementary devices are maintained at a predetermined voltage value with respect to the second terminals of the first and second complementary devices and for determining biasing points of the third and fourth complementary devices such that the third terminals of the third and fourth complementary devices are maintained at a predetermined voltage value with respect to the second terminals of the third and fourth complementary devices, and wherein impedance values at the third terminals vary in accordance with variation of a signal driven to the first terminals of the first through fourth complementary devices, when the first through fourth complementary devices are biased such that voltage values at the second and third terminals are adjusted to a predetermined value.

In accordance with other aspect of the invention, a single-ended differential amplifier circuit is provided. The single-ended differential amplifier circuit comprises: first unit having first and second active devices which have first, second, and third terminals, respectively, wherein current flowing from the second terminal to the third terminal has its quantity and direction being varying in dependant on the voltage driven to the first terminal; second unit having third and fourth devices which have first, second, and third terminals, respectively, wherein current flowing from the second terminal to the third terminal has its quantity and direction being varying in dependant on the voltage driven to the first terminal; and biasing means connected to the first terminals of the first and third active devices and an input terminal, and connected to the second terminals of the second and fourth active devices and an output terminal, for determining biasing points of the first and second units such that the first and second units operates in a differential relationship with respect to a signal driven to the input terminal, wherein the biasing means determines the biasing points such that one of the first and second units is substantially active.

These and other objects, features, aspects, and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Hereinafter, basic constitution of a single-ended differential circuit having complementary devices in accordance with an embodiment of the present invention is described. Then, circuitries to which the basic constitution of the embodiment of the present invention is applied will be described.

Figure 1:
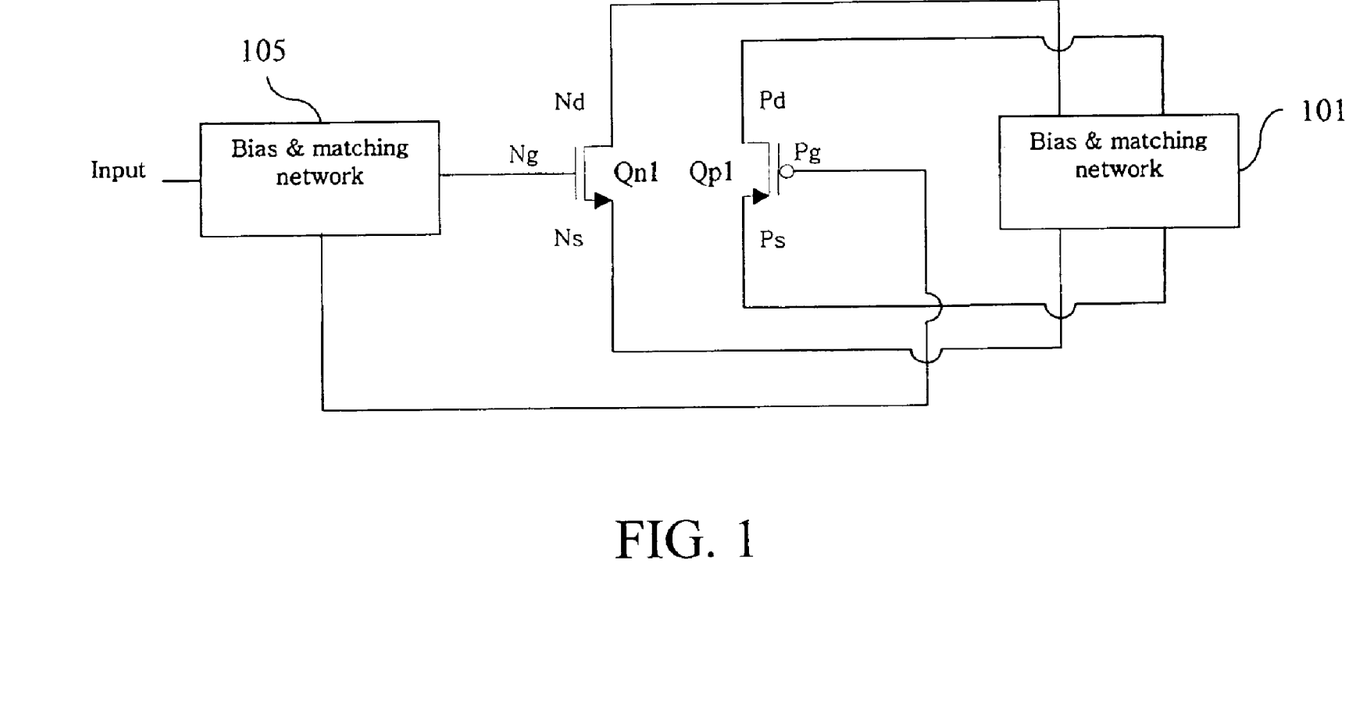
FIG. 1 is a circuit diagram showing a single-ended circuit having complementary devices in accordance with the present invention.

Basic Constitution of Single-ended Circuit having Complementary Devices in Accordance with the Present Invention FIG. 1 is a circuit diagram showing a single-ended circuit having complementary devices in accordance with the present invention.

The single-ended circuit having complementary devices in accordance with the present invention, employs a pair of complementary devices, the first and second complementary devices Qn1 and Qp1. Each of the first and second complementary devices Qn1 and Qp1 has gate Ng and Pg, source Ns and Ps, and drain Nd and Pd. The complementary devices Qn1 and Qp1 has a characteristic that the current flowing from the source Ns and Ps to drain Nd and Pd and vice versa has its quantity and direction which is varying in dependant on the voltage driven to the gate Ng and Pg or the voltage between the gate Ng and Pg and source Ns and Ps. Since the complementary devices Qn1 and Qp1 are conjugate pair, the quantity and direction of the current varies in opposite relationship.

The complementary device comprises conventional Bi-polar Junction Transistors (BJT), Junction Field Effect Transistors (JFET), Metal-Oxide Semiconductor Field Effect Transistors (MOSFET), and Metal Semiconductor Field Effect Transistors (MESFET).

Among such a complementary device, it is known that the MOSFET shows the lowest characteristic difference between conjugate devices of almost equal size. Hereinafter, it will be set forth the description on the examples and embodiments applied to the MOSFET. However, the scope and idea of the present invention can be applied to other active devices which can constitute a complementary pair. Therefore, the concept and scope of the present invention should not be limited to the described examples and embodiments which are based on MOSFETs.

As shown in FIG. 1, drains Nd and Pd and sources Ns and Ps of the first and second complementary devices Qn1 and Qp1 are connected to a biasing and matching circuit 101. Gates Ng and Pg are connected to an input terminal via input side biasing and matching circuit 105.

In accordance with FIG. 1, a differential pair circuit comprises the first and second complementary devices Qn1 and Qp1 and biasing and matching circuit 101. According to the present invention, it is possible to connect a differential pair circuit to a single-ended signal line without using any balun circuitry, by using two complementary devices to provide a differential pair circuit.

The operation of the circuit shown in FIG. 1 will be described.

When input signal is driven to gates Ng and Pg, the first and second complementary devices Qn1 and Qp1 operates as a differential pair due to the complementary relationship between the first and second devices Qn1 and Qp1. In response to the polarity of the signal driven to the gates Ng and Pg, only one of the first and second complementary devices Qn1 or Qp1 is substantially activated or, otherwise, both of the first and second complementary devices Qn1 and Qp1 are activated.

When the input signal to gates Ng and Pg is sinusoidal and, furthermore, the first and second complementary devices Qn1 and Qp1 are operates in class B or C mode or as switching means, a portion of the sinusoidal input signal above a predetermined threshold level activates the first complementary device Qn1, while the other portion of the input signal, i.e., below the threshold level, activates the second complementary deice Qp1. In general, the threshold level is determined by the input side biasing and matching circuit. In this specification, the structure of a circuit which has this characteristic is called differential pair structure.

By combining the outputs from the four output terminals of the first and second complementary devices Qn1 and Qp1, either a signal which is in the same phase with the input signal or a signal which is in opposite phase with the input signal may be acquired.

When the biasing and matching circuit 101 is designed such that the first and second complementary devices Qn1 and Qp1 form either a source follower or a common source mode amplifier and, moreover, output is taken from the combination of the output signal of the four output terminals, a signal of either additive or subtractive interference component of the input sinusoidal signal may be acquired.

Moreover, by combining the signal from drains and sources of the first and second complementary devices Qn1 and Qp1 with appropriate ratio, either in phase or differential signal with respect to the input signal at the gates Ng and Pg may be acquired. For example, when voltage between the sources Ns and Ps of the first and second complementary devices is taken as output, the output signal is in phase with the input signal. Voltage between the drains Nd and Pd of the first and second complementary devices is also in phase with the input signal.

Contrarily, when voltage between the source Ns of the first complementary device and the drain Pd of the second complementary devices is taken as output, the output signal is in opposite phase with the input signal. Voltage between the drains Nd of the first complementary device and Ps of the second complementary devices is also in opposite phase with the input signal.

Depending on the biasing and matching circuit 101 and the input side biasing and matching circuit 105, the circuit of in FIG. 1 shows various characteristics. By using these characteristics, the circuit of FIG. 1 may be employed in various applications, as shown below.

Figure 2:
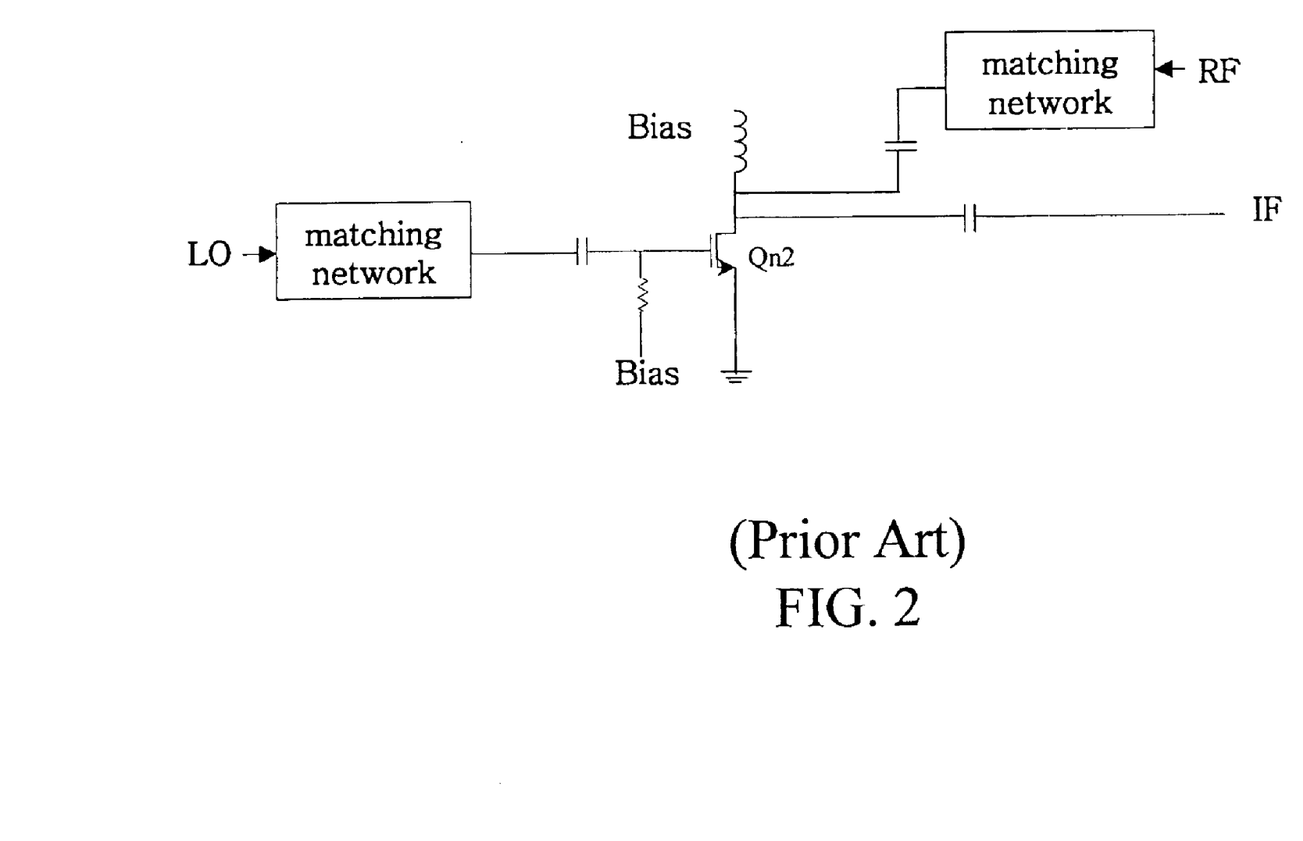
FIG. 2 is a circuit diagram for showing a conventional RF resistive mixer circuit.

As mentioned above, each of the first and second complementary devices is preferably N type and P type MOSFET device, respectively. By using N type and P type MOSFET devices, the good matching characteristic of the MOSFET can be advantageously used in the present invention. Further, when MOSFET devices are used, N type and P type devices can be made on a single substrate. Also, it is known in the art that N type and P type MOSFETs can be formed on a same wafer. Therefore, the circuit in accordance with the present invention can be made easily and with low cost.
Embodiment where Differential Circuit using Complementary Devices is Applied to RF Mixer Circuit FIG. 2 is a circuit diagram for showing a conventional RF resistive mixer circuit. Referring to FIG. 2, the conventional RF resistive mixer is explained. Then, an embodiment of the present invention where differential pair circuit having complementary devices is applied to an RF mixer according to the present invention is described.

As shown in FIG. 2, drain Nd of an active device Qn2 is connected biasing and matching circuits. Source Ns is grounded. Gate Ng is connected to an input terminal via an input side biasing and matching circuit.

When the active device Qn2 is biased and matched at an appropriate biasing point by adjusting the drain side and input side biasing and matching circuits, the active device has characteristic that impedance value at the drain side where high frequency signal RF is driven varies according to the variation of the local oscillation signal LO driven to the gate. Throughout the specification, MOSFET is used as active devices used for the embodiments of the present invention. Any kind of active devices which has the same characteristic as that of MOSFET that the impedance at drain side varies according to the variation of the local oscillation signal driven to gate, can also be used as alternatives for MOSFET. For example, in the circuit of FIG. 2, MESFET may also be used instead of MOSFET.

At the gate Ng of the active device Qn2, local oscillation signal LO is driven via biasing and matching circuits. At the drain Nd of the active device Qn2, high frequency signal RF is driven via biasing and matching circuits. The local oscillation signal LO is mixed with the high frequency signal RF at the circuit of FIG. 2. The output signal, i.e., an intermediate frequency signal IF, is output through an output terminal.

More specifically, source of the active device Qn2 is connected to ground. The drain of the active device Qn2 is connected to the first power source, e.g., positive voltage source, via biasing and matching circuits. According to a preferable embodiment, the positive voltage source is a power source which is able to provide voltage of standard positive voltage value such as +3 or +5 volt (V).

The drain of the active device Qn2 receives high frequency signal RF which the local oscillation signal LO is mixed with. In this way, intermediate frequency signal IF appears at the drain of the active device Qn2. The intermediate frequency is determined by the mixing of the local oscillation signal LO and high frequency signal RF.

The operation of the RF resistive mixer of FIG. 2 will be described.

The drain side and input side biasing and matching circuits are adjusted such that the active device Qn2 is biased to operate at linear region. In accordance with variation of the local oscillation signal LO driven to the gate, impedance value at the drain Nd side, to which the high frequency signal RF is driven, varies. As the impedance value at the drain Nd side varies according to the variation of the local oscillation signal LO, wave shape of the high frequency signal RF at the drain Nd side varies. Consequently, the signal which appears at the drain Nd, has frequency of either sum of or difference between the frequencies of the local oscillation signal LO and high frequency signal RF. When the mixer circuit functions as up-conversion mixer, it outputs the sum frequency signal. Otherwise, when the mixer circuit outputs the difference frequency signal, then, the mixer circuit functions as down-conversion mixer.

The mixer circuit of FIG. 2 operates with relatively high linearity, since it operates at linear region. However, it suffers from the local oscillation signal component appearing at the drain Nd side. As a result of the appearance of the local oscillation signal component at the drain Nd side, leakage of the local oscillation signal through an antenna occurs. The leakage of the local oscillation signal degrades performance of a RF device where the mixer circuit is used. Especially in the RF equipment, preventing the leakage of local oscillation signal, i.e., isolation of local oscillation signal, is one of the important factor to be considered. As shown above, the RF mixer circuit of FIG. 2 is not good at isolating the local oscillation signal.

Figure 3:
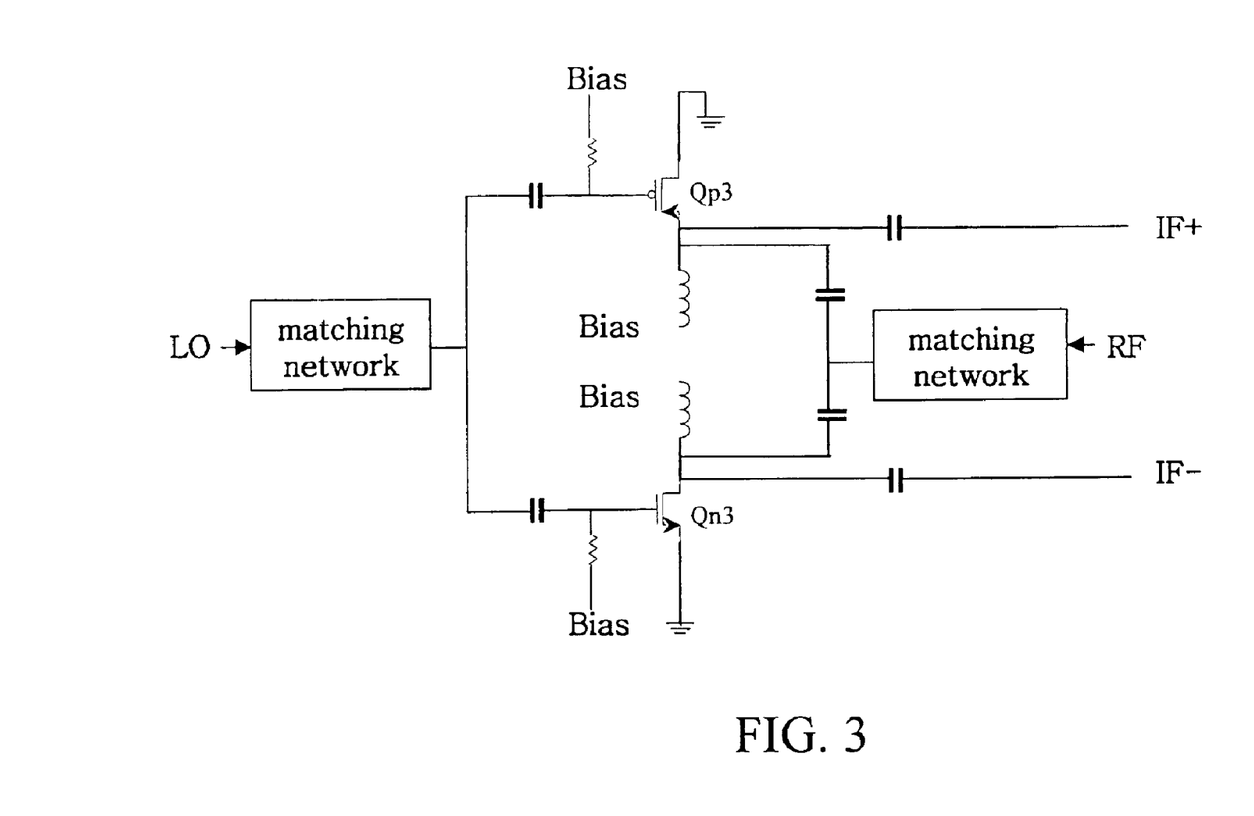
FIG. 3 is a circuit diagram for showing an embodiment where differential pair circuit having complementary devices is applied to a RF resistive mixer in accordance with the present invention.

FIG. 3 is a circuit diagram for showing an embodiment where differential pair circuit having complementary devices is applied to a RF resistive mixer in accordance with the present invention.

As shown in FIG. 3, drains Nd and Pd and sources Ns and Ps of the first and second active devices Qn3 and Qp3 are connected to biasing and matching circuits. Gates Ng and Pg are connected to an input terminal via input side biasing and matching circuits.

The first and second complementary devices are in complementary relationship, i.e., a conjugate pair. Preferably, the first and second complementary devices Qn3 and Qp3 are N type and P type MOSFET, i.e., NMOS and PMOS, respectively. The first and second complementary devices Qn3 and Qp3 have a characteristic that, when they are biased and matched at appropriate biasing points by the drain, source, and input side biasing and matching circuits, impedance values at drain Nd and source Ps side, respectively, vary according to variation of the local oscillation signal LO driven to gates.

Gates Ng and Pg of the first and second complementary devices Qn3 and Qp3, respectively, are connected to an input terminal via biasing and matching circuits. Local oscillation signal LO is driven to the input terminal.

Drain Nd and source Ps of the first and second complementary devices, respectively, are connected to a high frequency signal RF input terminal via biasing and matching circuits. Drain Nd and source Ps are further connected to an output terminal to which an intermediate frequency signal IF is output as a result of the mixing operation.

More specifically, source and drain of the first and second complementary devices Qn3 and Qp3, respectively, are grounded. Drain and source of the first and second complementary devices Qn3 and Qp3, respectively, are connected to the first power source, e.g., positive voltage source. Preferably, the positive voltage source is a power source which is able to provide voltage of standard positive voltage value such as +3 or +5 volt (V). Drain of the second complementary device Qp3 is supplied with power from the first power source. Drain and source of the first and second complementary devices, respectively, are connected to ground via biasing circuits. Preferably, source of the first complementary device Qn3 is connected to the second power source, e.g., negative voltage source of −3 or −5 volt. Many other power supplying methods may be used for the first and second power source. The scope of the present invention should not be interpreted according to a specific power supplying method which is used.

It can be appreciated that the first complementary device Qn3, where the source is grounded and output is taken from the drain, operates in common source configuration. On the other hand, the second complementary device Qp3 is understood to operate in source follower configuration, since the drain is grounded and output is taken from the source.

Drain and source of the first and second complementary devices Qn3 and Qp3, respectively, are driven with high frequency signal RF through biasing circuits. In this way, intermediate frequency signal IF having frequency determined by mixing of the local oscillation signal LO at the gate and the high frequency signal RF at the source and drain appears at the drain and source of the first and second complementary devices Qn3 and Qp3, respectively.

In the embodiment, the first and second complementary devices are preferably N type and P type MOSFET device, respectively. By using N type and P type MOSFET devices, the good matching characteristic of the MOSFET can be advantageously used in the present invention. Further, when MOSFET devices are used, N type and P type devices can be made on a single substrate. Also, N type and P type MOSFETs can be formed on a same wafer. Therefore, the circuit in accordance with the present invention can be made easily and with low cost.

Operation of the circuit illustrated in FIG. 3 will be described more specifically.

When input signal is driven to gates Ng and Pg, the first and second complementary devices Qn3 and Qp3 operates as a differential pair. If output is taken from the voltage between sources Ns and Ps or drains Nd and Pd of the complementary devices, the output is in phase with the input signal. On the other hand, if output is taken from the voltage between source Ns and drain Pd or drain Nd and source Ps of the first and second complementary devices Qn3 and Qp3, respectively, the output is opposite in phase with the input signal.

As shown in FIG. 3, if high frequency signal RF is driven simultaneously to the drain Nd and source Ps of the first and second complementary devices Qn3 and Qp3, respectively, local oscillation signal components, which appear in the drain Nd and source Ps of the first and second complementary devices Qn3 and Qp3, respectively, interfere with each other and are cancelled out. Therefore, local oscillation signal component does not appear at the input terminal to which high frequency signal is driven. Further, intermediate frequency signal IF can be acquired from either drain Nd of the first complementary device Qn3 or source Ps of the second complementary device Qp3. More specifically, the intermediate frequency signals which appear at drain Nd and source Ps of the first and second complementary devices Qn3 and Qp3, respectively, are opposite in their phase.

Since source of the first complementary device Qn3 is grounded and intermediate frequency signal IF is taken from drain while local oscillation signal LO and high frequency signal RF are driven to gate and drain, respectively, local oscillation signal LO component which appears in the signal taken from the drain is opposite in phase with the signal at the gate Ng. Further, since drain of the second complementary device Qp3 is grounded and intermediate frequency signal IF is taken from source while local oscillation signal LO and high frequency signal RF are driven to gate and drain, respectively, local oscillation signal LO component which appears in the signal taken from the source is in phase with the signal at the gate Pg.

Therefore, the local oscillation signal components which appear at the gates Ng and Pg, respectively, interfere with each other and, thereby, cancel out. With the cancellation, there is substantially no local oscillation signal component appeared at the input terminal where high frequency signal RF is driven. In this way, LO to RF isolation is good. This effect is achieved by the gist of the present invention where input and output terminals are in the single-ended structure while the active devices operate in a differential pair configuration by using a complementary devices.

Figure 4:
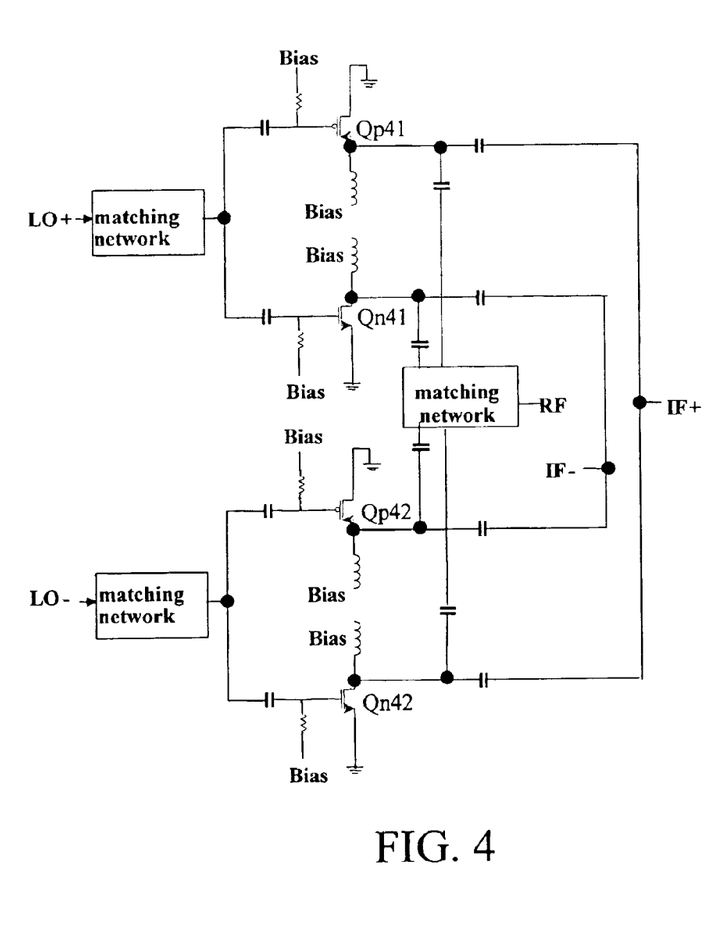
FIG. 4 is a circuit diagram for showing another embodiment of the present invention where differential pair circuit having complementary devices is applied to a RF mixer circuit.

FIG. 4 shows another embodiment of the present invention where differential pair circuit having complementary devices is applied to a RF mixer circuit. The mixer circuit of FIG. 4 is in single-balanced structure.

As shown in FIG. 4, a RF mixer circuit according to an embodiment of the present invention comprises first and second complementary group. The first complementary group comprises first and second complementary devices Qn41 and Qp41 which are conjugate pair. The second complementary group comprises third and fourth complementary devices Qn42 and Qp42 which are conjugate pair. Preferably, the first and third complementary devices Qn41 and Qn42 are N type MOSFET. The second and fourth complementary devices Qp41 and Qp42 are preferably P type MOSFET. By using N type and P type MOSFET devices, the good matching characteristic of the MOSFET can be advantageously used in the present invention. Further, when MOSFET devices are used, N type and P type devices can be made on a single substrate. Also, N type and P type MOSFETs can be formed on a same wafer. Therefore, the circuit in accordance with the present invention can be made easily and with low cost.

In the first complementary group, the gates Ng and Pg of the first and second complementary devices Qn41 and Qp41 are connected to an input terminal via biasing and matching circuits. Local oscillation signal LO+ is driven to the input terminal. In the second complementary group, the gates Ng and Pg of the third and fourth complementary devices Qn42 and Qp42 are connected to an input terminal via biasing and matching circuits. Local oscillation signal LO− is driven to the input terminal. The local oscillation signals LO+ and LO− are opposite in phase with each other.

High frequency signal RF is driven to the first and second complementary groups in a similar manner as the embodiment shown in FIG. 3.

Local oscillation signal components, which appear in the drain Nd and source Ps of the first and fourth complementary devices Qn41 and Qp42, respectively, interfere with each other and are cancelled out. Similarly, local oscillation signal components, which appear in the drain Nd and source Ps of the third and second complementary devices Qn42 and Qp41, respectively, interfere with each other and are cancelled out. Therefore, local oscillation signal component does not appear at the input terminal to which high frequency signal is driven. Intermediate frequency signal IF− can be acquired from connection of drain Nd and source Ps of the first and fourth complementary devices Qn41 and Qp42. Intermediate frequency signal IF+ can be acquired from connection of source Ps and drain Nd of the second and third complementary devices Qp41 and Qn42.

According to the circuit shown in FIG. 4, not only local oscillation signal LO component which is generated from the transistor operation but also leakage of local oscillation signal LO which is originated from the parasitic components can also be cancelled out.

More specifically, local oscillation signal components which appear at drain and source of the first and second complementary device Qn41 and Qp41, respectively, through parasitic capacitances between gate and drain of the first complementary device Qn41 and gate and source of the second complementary device Qp41, respectively, are in phase with each other. Similarly, local oscillation signal components which appear at drain and source of the third and fourth complementary device Qn42 and Qp42, respectively, through parasitic capacitances between gate and drain of the third complementary device Qn42 and gate and source of the fourth complementary device Qp42, respectively, are in phase with each other.

On the other hand, local oscillation signal components, which appear at drain and source of the first and fourth complementary device Qn41 and Qp42, respectively, through parasitic capacitances between gate and drain of the first complementary device Qn41 and gate and source of the fourth complementary device Qp42, respectively, are in opposite phase with each other. Similarly, local oscillation signal components, which appear at source and drain of the second and third complementary device Qp41 and Qn42, respectively, through parasitic capacitances between gate and source of the second complementary device Qp41 and gate and drain of the third complementary device Qn42, respectively, are in opposite phase with each other.

Therefore, local oscillation signal components, which are generated from parasitic capacitances between gate and drain of the first complementary device Qn41 and gate and source of the fourth complementary device Qp42, respectively, interfere with each other and are canceled out. Similarly, local oscillation signal components, which are generated from parasitic capacitances between gate and source of the second complementary device Qp41 and gate and drain of the third complementary device Qn42, respectively, interfere with each other and are canceled out.

Figure 5:
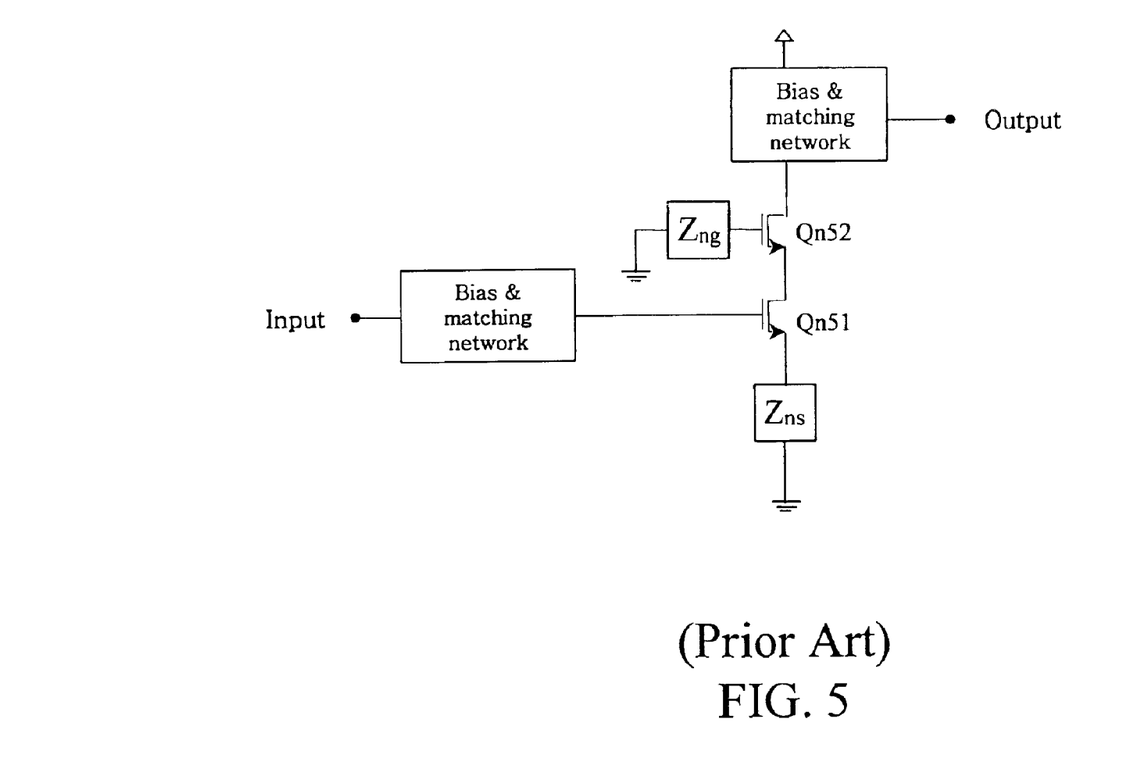
FIG. 5 is a circuit diagram for showing a conventional cascode amplifier circuit.

Embodiment where Differential Circuit using Complementary Devices is Applied to Cascode Amplifier Circuit FIG. 5 is a circuit diagram for showing a conventional cascode amplifier circuit. Referring to FIG. 5, the conventional cascode amplifier circuit is explained. Then, an embodiment of the present invention where differential pair circuit having complementary devices is applied to a cascode amplifier circuit according to the present invention is described.

As shown in FIG. 5, the first and second active devices Qn51 and Qn52 are serially connected such that drain and source of the first and second active devices Qn51 and Qn52, respectively, are connected. Source of the first active device Qn51 is grounded via impedance units. Gate of the first active device Qn51 is connected to an input terminal via input side biasing and matching circuits.

Gate of the second active device Qn52 is grounded via impedance units. Drain is connected to the first power source, e.g., positive voltage source, via biasing and matching circuits. According to a preferable embodiment, the positive voltage source is a power source which is able to provide voltage of standard positive voltage value such as +3 or +5 volt (V).

Input signal is driven from an input terminal to the gate Ng of the first active device Qn51 via biasing and matching circuits. Drain Nd of the second active device Qn52 is connected to an output terminal via biasing and matching circuits.

The cascode amplifier of FIG. 5 has advantages over a conventional common source amplifier as shown below. Miller capacitance between gate and drain of active devices can be decreased. Therefore, frequency characteristic of amplification is improved. Further, output impedance at the drain of active devices is increased. When the cascode amplifier circuit of FIG. 5 is used as a low noise amplifier, influence of output signal at the input terminal is decreased. That is, so called "reverse isolation problem" is highly improved. The reverse isolation problem is one of the important factor to be considered when direct conversion receiver is designed. For this reason, cascode amplifier circuit is widely used in the RF applications.

Figure 6:
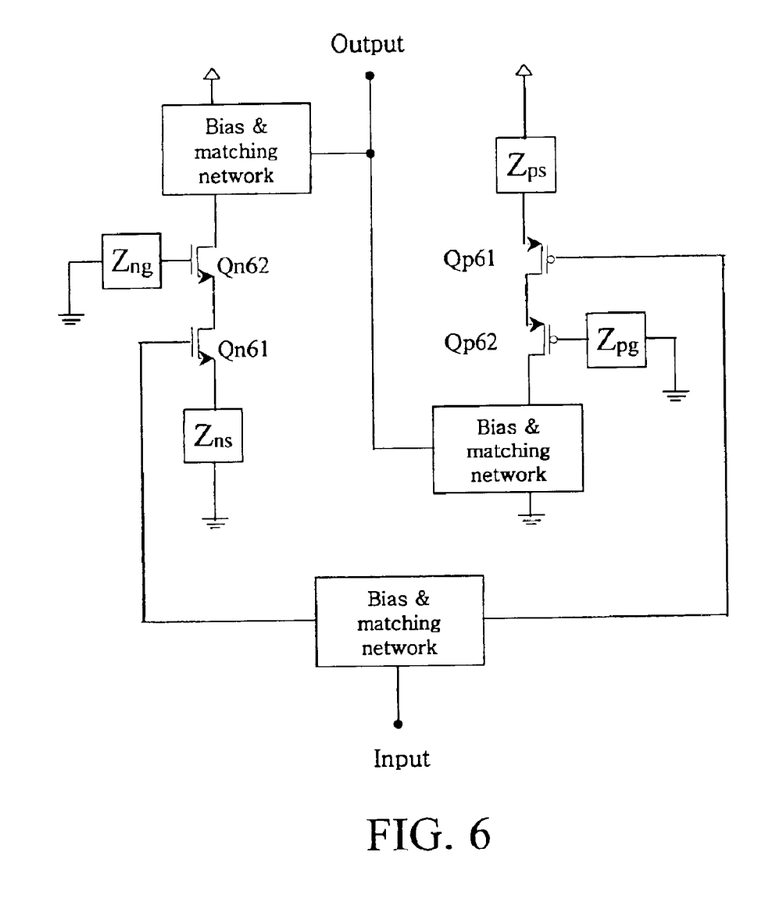
FIG. 6 is a circuit diagram for showing an embodiment where differential pair circuit having complementary devices is applied to a cascode amplifier circuit in accordance with the present invention.

FIG. 6 is a circuit diagram for showing an embodiment where differential pair circuit having complementary devices is applied to a cascode amplifier circuit in accordance with the present invention.

As shown in FIG. 6, the cascode circuit in accordance with the present invention comprises first and second cascode units. The first cascode unit comprises the first and second complementary devices Qn61 and Qn62. The second cascode unit comprises third and fourth complementary devices Qp61 and Qp62. Preferably, the first and second complementary devices Qn61 and Qn62 are N type MOSFET. The third and fourth complementary devices Qp61 and Qp62 are preferably P type MOSFET. By using N type and P type MOSFET devices, the good matching characteristic of the MOSFET can be advantageously used in the present invention. Further, when MOSFET devices are used, N type and P type devices can be made on a single substrate. Also, N type and P type MOSFETs can be formed on a same wafer. Therefore, the circuit in accordance with the present invention can be made easily and with low cost.

In the first cascode unit, the first and second complementary devices Qn61 and Qn62 are serially connected such that drain of the first complementary device Qn61 is connected to source of the second complementary device Qn62. Source of the first complementary device Qn61 is grounded via impedance units. Gate of the second complementary device Qn62 is grounded via impedance unit. Drain of the second complementary device is connected to the first power source, e.g., positive voltage source.

In the second cascode unit, the third and fourth complementary devices Qp61 and Qp62 are serially connected such that drain of the third complementary device Qp61 is connected to the source of the fourth complementary device Qp62. Source of the third complementary device Qp61 is connected to the first power source, e.g., positive voltage source. Gate of the fourth complementary device Qp62 is grounded via impedance unit. Drain of the second complementary Qn62 device is grounded via impedance units.

Gates of the first and third complementary devices Qn61 and Qp61 are connected to an input terminal via input side biasing and matching circuits. Drains Nd of the second and fourth complementary devices Qn62 and Qp62 are connected to an output terminal via biasing and matching circuits.

Operation of the circuit shown in FIG. 6 will be described.

As shown in FIG. 6, the first and second cacode units operates as a complementary pair and symmetrically. A portion of the input signal above a predetermined threshold level activates the first cascode unit, while the other portion of the input signal, i.e., below the threshold level, actives the second cascode unit. In general, the threshold level is determined by the input side biasing and matching circuit.

Due to the symmetry of the first and second cascode units which are in conjugate relationship, the circuit advantageously can cancel out even order distortion. The cancellation of even order distortion achieved by the circuit of FIG. 6, makes the circuit be applicable to direct conversion receivers which requires high level of rejection of second order distortion generated from DC offset problem.

INDUSTRIAL APPLICABILITY

According to the present invention, single-ended type signal can be processed by differential pair circuit having complementary devices, without using any balun circuitry. Therefore, many advantages which can be achieved by a differential pair circuit may also be achieved by circuits of single-ended structure.

A mixer circuit of differential pair structure having complementary devices was suggested, which can process single-ended type local oscillation signal LO and high frequency signal RF. By combining appropriately the outputs of the first and second complementary devices, it was possible to prevent the local oscillation signal LO component appearing at the output terminal. The mixer circuit in accordance with the present invention is advantageous in LO to RF isolation characteristic, since local oscillation signal LO component is substantially cancelled out at the input terminal to which high frequency signal RF is driven.

According to the present invention, a cascode amplifier circuit of differential structure was suggested. The cascode amplifier circuit according to the present invention is good at rejecting even order distortion.

The terms of degree such as "substantially," "about," and "approximately" as used herein mean a reasonable amount of deviation of the modified term such that the end result is not significantly changed. These terms should be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention are provided for illustration only, and not for the purpose of limiting the invention as defined by the appended claims and their equivalents.

What is claimed is:

1. A single-ended differential amplifier circuit comprising:
   first unit having first and second active devices respectively having first, second, and third terminals, current flowing from the second terminal to the third terminal having its quantity and direction varying dependant on the voltage driven to said first terminal of said first unit, said first and second active devices being N type MOSFET;

second unit having third and fourth devices respectively having first, second, and third terminals, current flowing from the second terminal to the third terminal having its quantity and direction varying dependant on the voltage driven to said first terminal of said second unit, said third and fourth active devices are P type MOSFET; and biasing means being connected to said first terminals of said first and third active devices and an input terminal, and being connected to said second terminals of said second and fourth active devices and an output terminal, for determining biasing points of said first and second units, said first and second units operating in a differential relationship with respect to a signal driven to said input terminal, said biasing means determining said biasing points such that one of said first and second units is substantially active.

2. The single-ended differential amplifier circuit of claim 1, wherein said biasing means determines biasing points of the first and second units such that current flowing from the first active device to the second active device of the first unit is in opposite phase to current flowing from the third active device to the fourth active device of the second unit.

3. A single-ended differential amplifier circuit comprising:

a first unit having first and second active devices respectively having first, second, and third terminals, current flowing from said second terminal to said third terminal having its quantity and direction varying dependant on the voltage driven to said first terminal of said first unit, said first and second active devices being N type MOSFET;

a second unit having third and fourth devices respectively having first, second, and third terminals, current flowing from said second terminal to said third terminal of said second unit having its quantity and direction varying dependant on the voltage driven to said first terminal of said second unit, said third and fourth active devices are P type MOSFET; and a biasing and matching circuit being connected to said first terminals of said first and third active devices and an input terminal, and being connected to said second terminals of said second and fourth active devices and an output terminal, to determine biasing points of said first and second units, said first and second units operating in a differential relationship with respect to a signal driven to said input terminal, said biasing and matching circuit determining said biasing points such that one of said first and second units is substantially active.

4. The single-ended differential amplifier circuit of claim 3, wherein said biasing and matching circuit determines biasing points of said first and second units such that current flowing from said first active device to said second active device of said first unit is in opposite phase to current flowing from said third active device to said fourth active device of said second unit.

* * * * *